(12) United States Patent
Dey et al.

(10) Patent No.: US 11,304,344 B2
(45) Date of Patent: Apr. 12, 2022

(54) SCALABLE UNIVERSAL SENSOR DATA ACQUISITION WITH PREDICTABLE TIMING

(71) Applicant: HEWLETT PACKARD ENTERPRISE DEVELOPMENT LP, Houston, TX (US)

(72) Inventors: Nilashis Dey, Houston, TX (US); Peter Hansen, Cypress, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/528,423

(22) Filed: Jul. 31, 2019

(65) Prior Publication Data
US 2021/0037680 A1 Feb. 4, 2021

(51) Int. Cl.
*H05K 7/20* (2006.01)
*H04L 67/125* (2022.01)
*H05K 7/14* (2006.01)

(52) U.S. Cl.
CPC ....... *H05K 7/20836* (2013.01); *H04L 67/125* (2013.01); *H05K 7/1498* (2013.01)

(58) Field of Classification Search
CPC .... H05K 7/20836; H05K 7/1498; H05K 7/20; H04L 67/125
See application file for complete search history.

(56) References Cited

U.S. PATENT DOCUMENTS

| | | | |
|---|---|---|---|
| 4,137,522 A * | 1/1979 | Stein | G08C 15/12 340/4.21 |
| 6,392,558 B1 * | 5/2002 | Schulmeyer | H04L 12/403 340/9.16 |
| 7,339,490 B2 | 3/2008 | Moore et al. | |
| 8,046,196 B2 | 10/2011 | Felcman et al. | |
| 9,310,784 B1 | 4/2016 | Roy | |
| 2003/0128702 A1 * | 7/2003 | Satoh | G06F 13/37 370/390 |
| 2004/0177187 A1 * | 9/2004 | Merkin | G06F 13/4031 710/107 |
| 2009/0287456 A1 | 11/2009 | Tran et al. | |
| 2010/0023657 A1 * | 1/2010 | Fukuda | G06F 13/161 710/37 |

(Continued)

OTHER PUBLICATIONS

Chen et al., "A Sensor System for High-Fidelity Temperature Distribution Forecasting in Data Centers", ACM Transactions on Sensor Networks, vol. 11, No. 2, Article 30, Dec. 2014, pp. 30:1-30:25.

*Primary Examiner* — Vincent H Tran
(74) *Attorney, Agent, or Firm* — Nolte Lackenbach Siegel

(57) ABSTRACT

A device that is communicating with other devices via a common bus discovers addresses of the other devices. The device transmits data to the other devices at a transmit time determined based on the addresses of the other devices. The device predicts receive times at which data will be received from the other devices and determines the transmit time based on predicted receive times, avoiding data collisions. The devices may include universal sensor data acquisition devices ("USDADs") that are each connectable to different types of sensors arranged within a server rack. Each USDAD determines a type of a connected sensor that is within a server rack and collects sensor data from the connected sensor.

17 Claims, 8 Drawing Sheets

(56) References Cited

U.S. PATENT DOCUMENTS

| | | | |
|---|---|---|---|
| 2010/0070666 A1* | 3/2010 | Brindle | H04L 12/417 |
| | | | 710/117 |
| 2010/0185841 A1* | 7/2010 | Monreal | G06F 13/37 |
| | | | 713/2 |
| 2010/0305767 A1* | 12/2010 | Bengtson | G05B 19/0421 |
| | | | 700/287 |
| 2012/0072626 A1* | 3/2012 | Scott | G06F 13/4247 |
| | | | 710/104 |
| 2012/0087272 A1* | 4/2012 | Lemkin | H04L 67/12 |
| | | | 370/252 |
| 2012/0284441 A1* | 11/2012 | Landman | G06F 13/4295 |
| | | | 710/110 |
| 2014/0365702 A1* | 12/2014 | Ray | G06F 13/4068 |
| | | | 710/305 |
| 2015/0256384 A1* | 9/2015 | Van Den Hurk | H04L 61/2015 |
| | | | 709/220 |
| 2016/0226590 A1* | 8/2016 | Jobert | H04J 14/0267 |
| 2016/0335102 A1* | 11/2016 | Santesson | G06F 13/387 |
| 2016/0344266 A1* | 11/2016 | Ogawa | H04L 67/12 |
| 2019/0342114 A1* | 11/2019 | Stamatakis | H04W 4/38 |
| 2020/0176976 A1* | 6/2020 | Lewandowski | H02H 9/004 |

\* cited by examiner

SCALABLE UNIVERSAL SENSOR DATA ACQUISITION WITH PREDICTABLE TIMING

BACKGROUND

A server rack houses servers, cooling devices, sensors, and a central controller. The sensors collect sensor data representing conditions within the server rack, and the central controller controls the cooling devices based on the collected sensor data.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
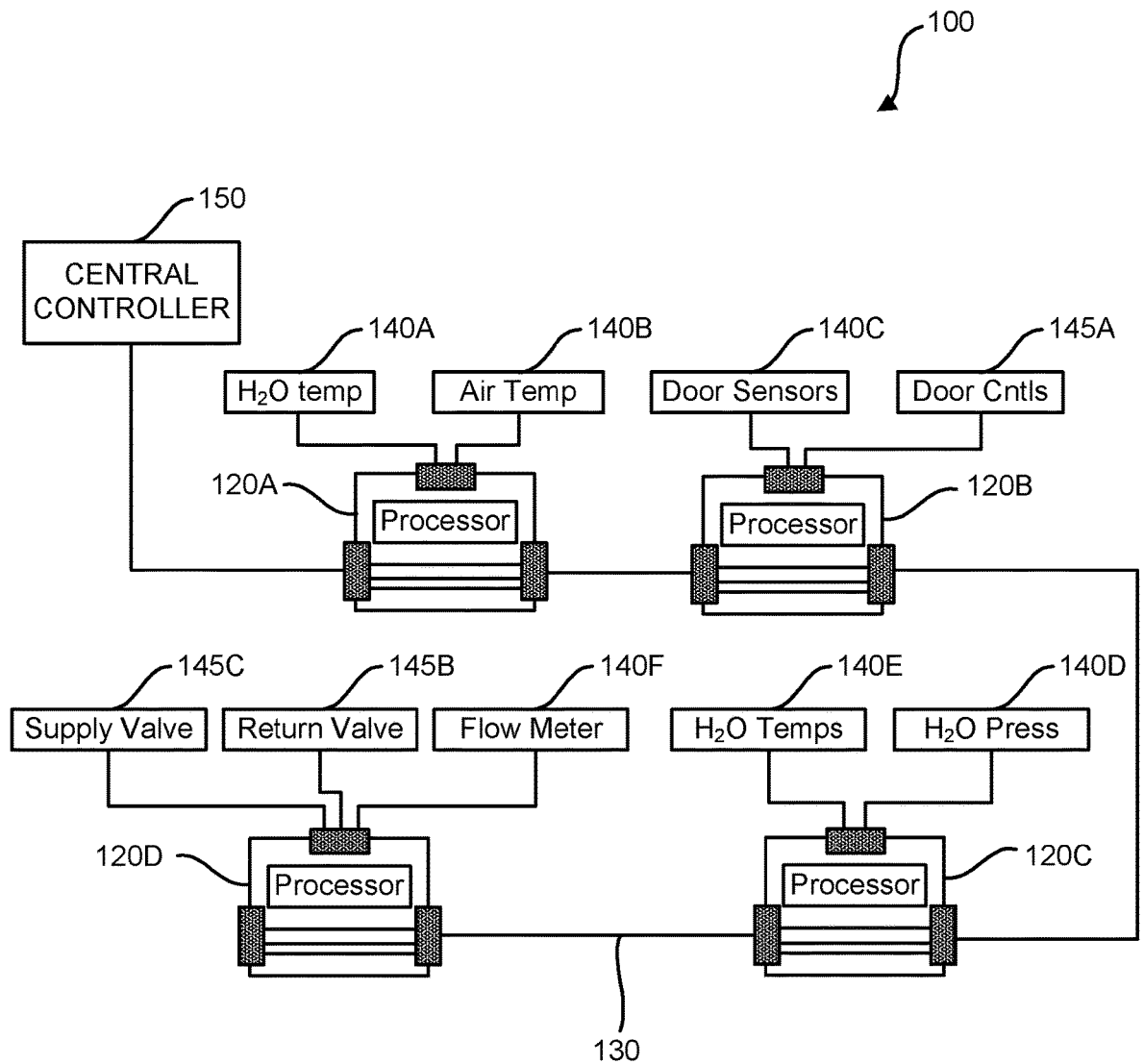
FIG. 1A schematically illustrates a system including universal sensor data acquisition devices, according to one or more examples of the disclosure.

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Sensors included in server racks housing servers have traditionally been limited to temperature sensors and current/power sensors. As used herein, a server rack refers to a structure that houses servers, and a sensor refers to a device that monitors conditions within the server rack.

With the advent of liquid cooling equipment, the types of sensors and other equipment that are included in server racks are expanding to include liquid flow sensors, liquid temperature sensors (such as resistance temperature detectors ("RTDs"), thermocouples, etc.), adjustable valves, flow meters, liquid pressure sensors, door sensors, door controllers, etc. Such sensors and other equipment are typically mounted at various locations within a server rack that may be hard to reach and may be several meters away from any server in the rack.

Approaches for monitoring many different conditions in a server rack using different types of sensors have been proposed. Such approaches use a rack management unit wired to different types of sensors included in the server rack. Each type of sensor is customized with specific input/output interfaces to monitor a specific condition. The sensors are connected to the rack management unit with hundreds of wires and cables. These wires and cables are typically thick, complex, and customized for specific types of sensors, making them expensive to provide and resulting in very long lead times for production.

These types of approaches are limited in scalability, as the number and type of input/output interfaces for each sensor cannot be changed after the initial design. Also, due to the customization of the sensors, the sensors need to be redesigned as form factors of server racks change from one generation to another. Further, these approaches are inflexible as the number and types of sensors included in the server rack cannot be changed once development is completed.

According to illustrative examples, one or more universal sensor data acquisition devices ("USDADs") are provided that are each connectable to different types of sensors and equipment within one or more server racks. That is, each USDAD is connectable to all of the sensors and equipment within one or more server racks. As referred to herein, a USDAD is a computing device that includes a processor and memory, is connectable to sensors and other equipment, and is capable of collecting sensor data, sending sensor data, receiving sensor data and initiating actions by connected equipment. The USDAD may also be connected to a central controller. As referred to herein, a central controller is a computing device that provides control signals and power to a USDAD and other devices within a server rack.

According to illustrative examples, multiple USDADs may be connected in a serial sequence. The USDADs are able to detect a type of connected sensor and/or equipment. As each of the USDADs are connectable to the different types of sensors and equipment within one or more server racks, the USDADs are interchangeable, and customization is not needed. This greatly reduces the cost, flexibility, and lead time in manufacturing compared to previous sensor systems. Also, USDADs may be added and removed as needed, making this approach scalable.

FIG. 1A conceptually illustrates a system including universal sensor data acquisition devices, according to one or more examples of the disclosure. As shown in FIG. 1A, the system 100 includes universal sensor data acquisition devices ("USDADs") 120A, 120B, 120C, and 120D arranged in a serial sequence and connected by a common bus 130. The USDADs 120A, 120B, 120C, and 120D are "universal" in the sense that they include input interfaces and output interfaces for connecting to the different types of sensors and equipment mounted within and/or around a server rack, as described in further detail below. Although four USDADs are shown in FIG. 1A, it should be appreciated that there may be any number of USDADs. According to one example, there may only be one USDAD. Also, the number of USDADs may be changed as desired (either on the fly or during the development cycle), resulting in great flexibility.

The USDADs 120A, 120B, 120C, and 120D may be implemented with a computing device including a processor and a memory, such as the computing device 400 shown in FIG. 4 and described in more detail below. According to one example, the USDADs 120A, 120B, 120C, and 120D may be connected in a daisy chain sequence to a central controller 150 via the common bus 130, with the USDAD 120A being directly connected to the central controller 150. The USDADs 120A, 120B, 120C and 120D may exchange collected sensor data with each other and the central controller 150 may collect sensor data from and supply power to each of the USDADs 120A, 120B, 120C, and 120D via the common bus 130. Additionally, the central controller 150 may send control signals to the USDADs 120A, 120B, 120C and 120D to control connected equipment based on collected sensor data. Further, each of the USDADs 120A, 120B, 120C, and 120D may send control signals to another USDAD in the sequence via the common bus 130 to initiate action by equipment connected to the other USDAD based on collected sensor data. This is described in further detail below.

The common bus 130 may be an off-the-shelf bus, such as a half-duplex RS-485 bus, using a multi-master bus protocol. Using a non-customized common bus eases communication of sensor data to the central controller 150. As all the USDAs 120A, 120B, 120C, and 120D are connected via the common bus 130, they can communicate with each other and with the central controller 150 with minimal volume cable routing. This provides an advantage in terms of costs and lead team compared to traditional customized cable routing.

Figure 1B:
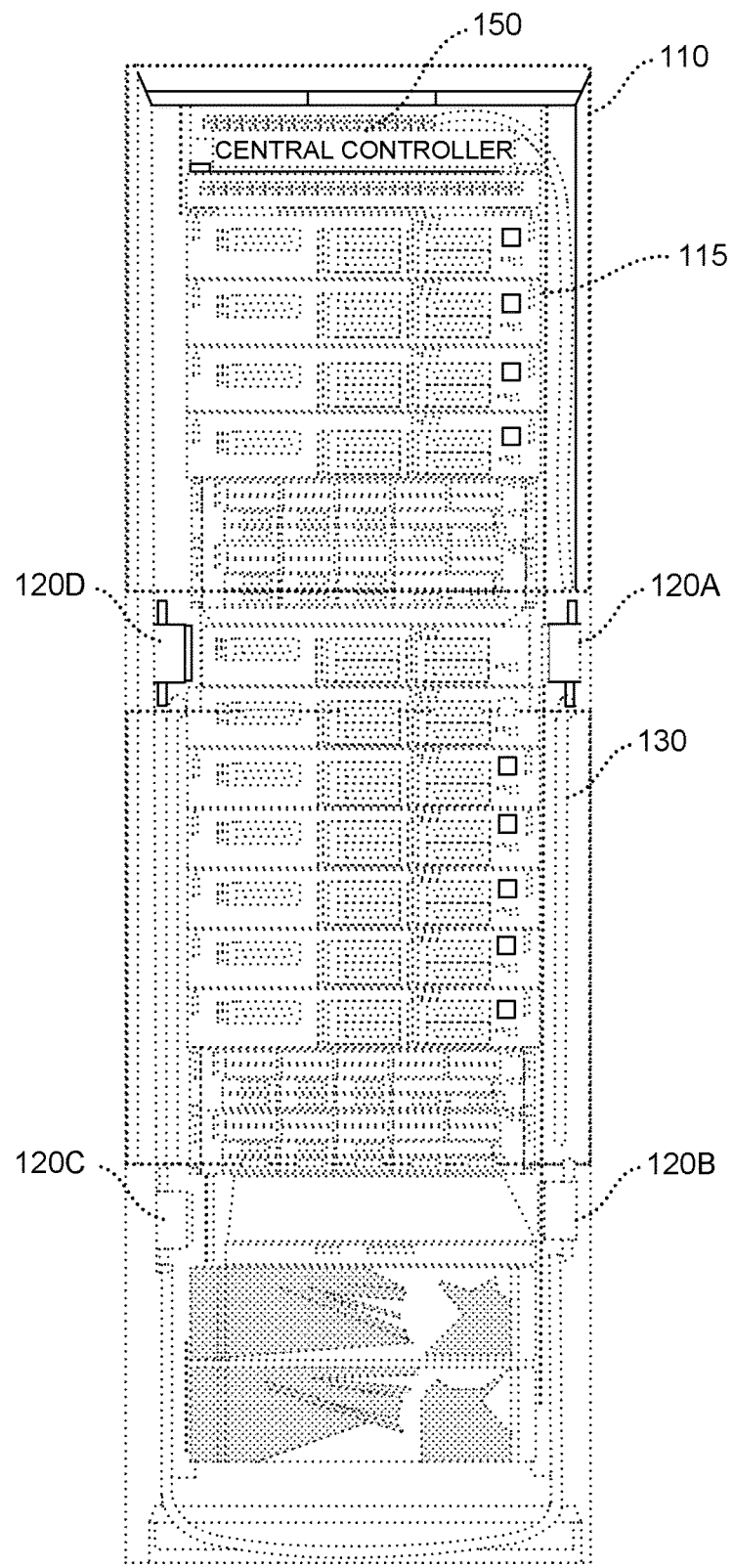
FIG. 1B conceptually depicts a server rack within which the system shown in FIG. 1A may be enclosed, according to one or more examples of the disclosure.

FIG. 1B conceptually illustrates a server rack 110 within which the system 100 shown in FIG. 1A may be enclosed, according to one or more examples of the disclosure. As shown in FIG. 1A, the USDAs 120A, 120B, 120C, and 120D and the central controller 150 may be arranged at different positions within the rack, with the USDAs connected to each other and to the central controller 150 via the common bus 130. The server rack 110 also houses server 115. Although not shown for ease of illustration, it should be appreciated that the USDADs 120A, 120B, 120C, and 120D and the central controller 150 need not be enclosed within the server rack 110, and the server rack 110 does not need predefined structures for mounting the USDADs. Furthermore, the form factors for the servers 115 and other equipment enclosed by the server rack 110 may not need modification.

The USDADs 120A, 120B, 120C, and 120D may be attached to a top, side or door of the server rack 110 or attached to equipment around the server rack 110, such as a water pipe (not shown). This is made possible by powering the USDADs with a DC power supply (not shown), such that the USDADs are compact enough to fit into such spaces. The USDADs 120A, 120B, 120C, and 120D may be attached to the server rack 110 or other equipment around the server rack 110 using any suitable connection device, such as a retention bracket.

Although one server rack 110 is shown in FIG. 1B for simplicity of illustration, it should be appreciated that the USDADs 120A, 120B, 120C, and 120D may be scalable across several server racks. This is made possible by powering the USDADs with, for example 48V, so that than can span a long distance, e.g., across several server racks. The central controller 150 can be used, in conjunction with the USDADs 120A, 120B, 120C, and 120D, to control equipment in several server racks, thus reducing management costs.

According to illustrative examples, each of the USDAs 120A, 120B, 120C and 120D are connectable to all of the different types of sensors arranged within a server rack (or multiple server racks). For example, the sensors may include liquid temperature sensors (such as thermocouple and resistance temperature detectors (RTDs)), air temperature sensors, door sensors, liquid pressure sensors, flow meters, leak detectors, etc. The USDADs 120A, 120B, 120C, and 120D are also each connectable to all of the different types of equipment within and/or around a server rack, such as door controllers, supply valves, return valves, power supplies, etc.

In the system 100 shown in FIG. 1A, the USDA 120A is connected to a water temperature sensor 140A and an air temperature sensor 140B. The USDAD 120B is connected to door sensors 140C and door controllers 145A. The USDAD 120C is connected to a water pressure sensor 140D and water temperature sensor 140E, and the USDAD 120D is connected to a flow meter 140F, a return valve 145B and a supply valve 145C.

Each of the USDADs 120A, 120B, 120C, and 120D have input/output (I/O) interfaces that are suitable for connecting to all the different types of sensors (to receive sensor data) and equipment (to send control signals to initiate action by the equipment). In addition, each of the USDADs 120A, 120B, 120C, and 120D include I/O interfaces for receiving and sending data (such as control signals and collected sensor data) to other USDADs and the central controller 150. Also, each of the USDADs 120A, 120B, 120C, and 120D include an input interface for receiving power from a power supply.

According to an illustrative example, the sensor input interfaces and equipment output interfaces may include pins to which sensor and equipment wires may be connected. The power and data input/output interfaces may include data and power input/output ports to which power and data cables may be connected. In one example, the power supplied to each USDAD may be 48V.

Each of the USDADs 120A, 120B, 120C, and 120D determines a type of a sensor (or types of sensors) connected to it, as well as a type of equipment (or types equipment) connected to it. This determination may be made in various ways.

According to one example, type(s) of connected sensor(s) and/or equipment may be determined by detecting the connection of sensor(s) or equipment at input/output interfaces using presence pins or other presence detection techniques. That is, the input/output interfaces for connecting to sensor(s) and/or equipment may include pins that are assigned to specific sensors or equipment, such that connection of the specific sensors and/or equipment may be detected by the presence of a connection on those pins. According to another example, all the pins may be used to connect to all of the different types of sensors, and each USDAD may determine what type of sensor is connected based on signals received from the connected sensor.

According to another example, type(s) of connected sensor(s) and/or equipment may be determined based on a location of a USDAD with respect to the server rack 110. For this purpose, each of the USDADs 120A, 120B, 120C, and 120D may store information in a table (not shown) associating specific types sensors and equipment with specific locations at which the sensors and equipment are installed within or around the server rack. By determining its location with respect to the server rack, each of the USDADs 120A, 120B, 120C and 120D is able to determine the type(s) of sensor(s) and/or equipment that is/are connected based on this stored information. Additionally, each of the USDADs 120A, 120B, 120C, and 120D may store information in the table associating specific sensors and equipment with the specific locations, such that each USDAD is able to determine not only a type of a connected sensor and/or equipment but is also able to identify a specific sensor or specific equipment that is connected.

According to one example, assuming that the USDADs are arranged in a sequence at specific positions along the common bus 130 with respect to the server rack, each of the USDADs 120A, 120B, 120C, and 120D may determine its location with respect to the server rack 110 by detecting its position in the sequence with respect to the other USDADs connected via the common bus 130. The position with respect to the other USDADs may be detected using a "BUDDY SYSTEM" position detection technique. This may be understood with reference to FIG. 2A.

Figure 2A:
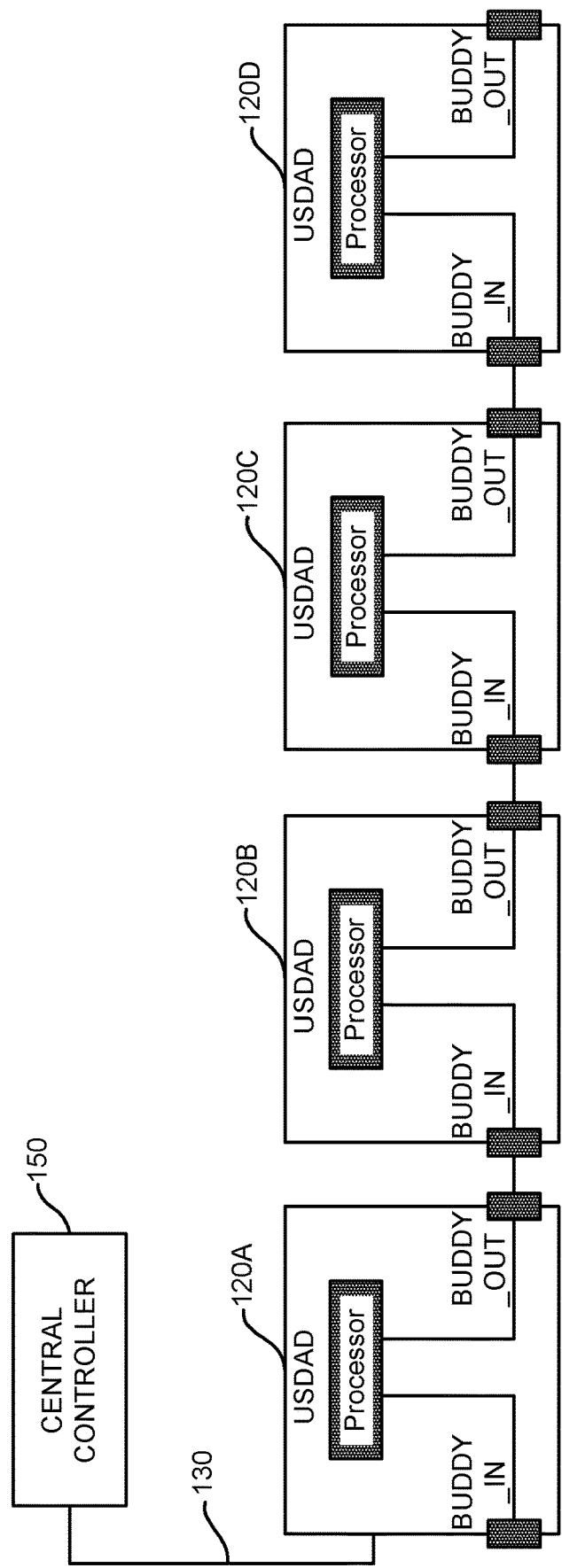
FIG. 2A schematically illustrates a universal sensor data acquisition device position detection technique, according to one or more examples of the disclosure.

Referring to FIG. 2A, the central controller 150 is connected to the sequence of USDADs 120A, 120B, 120C, and 120D via the common bus 130. The central controller 150 performs a position detection process to determine the position of each of the USDADs 120A, 120B, 120C, and 120D in the sequence. As part of this process, each of the USDADs 120A, 120B, 120C, and 120D detects its position in the sequence relative to the other USDADs in the sequence by exchanging "BUDDY_IN" signals and "BUDDY_OUT signals".

In this example, the sequence detection process begins with the central controller 150 sending a signal to the USDAD 120A. The USDAD 120A receives this signal as a "BUDDY-IN" signal and detects its position as being the first USDAD in the sequence with respect to the central controller 150. The USDAD 120A, in turn, sends out a "BUDDY_OUT" signal to the USDAD 120B. The BUDDY_OUT signal from the USDAD 120A indicates that the USDAD 120A is at the first position in the sequence, relative to the central controller 150. The USDAD 120B receives the "BUDDY_OUT" signal from the USDAD 120A as a "BUDDY-IN" signal. Based on the position of the USDAD 120A as indicated in the received BUDDY-OUT signal, the USDAD 120B detects its position as being the second USDAD in the sequence, relative to the central controller 150.

The USDAD 120B, in turn, sends out a "BUDDY-OUT" signal to the 120C. The BUDDY_OUT signal from the USDAD 120B indicates that the USDAD 120A is at the first position and the USDAD 120B is at the second position in the sequence, relative to the central controller 150. The USDAD 120C receives the "BUDDY_OUT" signal from the USDAD 120B as a "BUDDY-IN" signal. Based on the position of the USDAD 120B as indicated in the received BUDDY-OUT signal, the USDAD 120C detects its position as being the third USDAD in the sequence, relative to the central controller 150.

The USDAD 120C, in turn, sends out a "BUDDY-OUT" signal to the 120D. The BUDDY_OUT signal from the USDAD 120C indicates that the USDAD 120A is at the first position, the USDAD 120B is at the second position, and the USDAD 120C is at the third position in the sequence, relative to the central controller 150. The USDAD 120D receives the "BUDDY_OUT" signal from the USDAD 120C as a "BUDDY-IN" signal. Based on the position of the USDAD 120C as indicated in the received BUDDY-OUT signal, the USDAD 120D detects its position as being the fourth USDAD in the sequence, relative to the central controller 150.

The process repeats in the opposite direction, with each of the USDADs 120A, 120B, 120C, and 120D generating a return "BUDDY-OUT" signal indicating its position in the sequence and sending the return "BUDDY-OUT" signal to a neighboring USDAD in the sequence, such that each USDADs 120A, 120B, 120C, and 120D learns the positions of the other USDADs in the sequence. In the end, information indicating the positions of the USDADs 120A, 120B, 120C, and 120D is collected by the central controller 150 based on a return "BUDDY-OUT" signal generated by the USDAD 120A.

Using the position detection process described above, each of the USDADs 120A, 120B, 120C, and 120D learns the positions of the other USDADs in the sequence. In addition, each USDAD learns what sensors and equipment may be connected to each USDAD based on the information stored in each USDAD associating specific sensors and equipment with specific locations at which the sensors and equipment are installed within or around the server rack.

According to another example, each of the USDADs 120A, 120B, 120C, and 120D can determine its position with respect to the other USDADs through voltage measurement along a single wire. Referring to FIG. 2A, one USDAD, e.g., USDAD 120A, may be considered a "master" USDAD, and the other USDADs may be considered "daughter" USDADs. The USDADs 120A, 120B, 120C, and 120D may be connected via a single wire that carries a voltage signal. In this example, USDAD 120A may have a pull-up resistor connected to a VDD supply voltage of, for example 12V. The USDADs 120B, 120C, and 120D may each have a pull-down resistor that may be connected to ground, such that the voltage along the wire is reduced at each USDAD by a given amount, e.g., 2V. By measuring the voltage along the wire, each of the USDADs may determine its position in the sequence relative to the other USDADs.

For example, USDAD 120A may determine that it is the first USDAD in the sequence by measuring 12 V along the wire. USDAD 120B may determine that it is the next USDAD in the sequence by measuring 10 V along the wire. USDAD 120C may determine that it is the third USDAD I the sequence by measuring 8 V along the wire, and so on.

According to yet another example, each of the USDADs 120A, 120B, 120C, and 120D can determine its position with respect to the other USDADs through address discovery instead of or in addition to the "BUDDY SYSTEM" technique described above. This may be understood with reference to FIG. 2B.

Figure 2B:
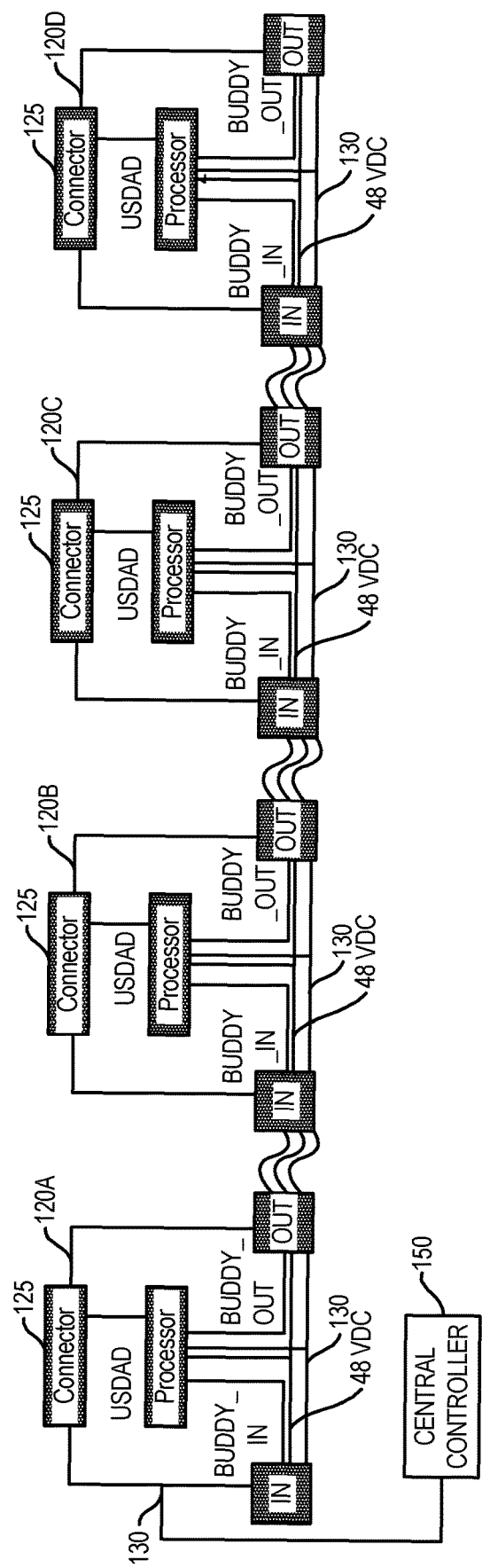
FIG. 2B schematically illustrates another universal sensor data acquisition device position detection technique, according to one or more examples of the disclosure.

Referring to FIG. 2B, each of the USDADs 120A, 120B, 120C, and 120D transmit and receive data to and from each other and to and from the central controller 150 in the form of packets. The packets include sensor and control data. Each packet includes a target address (which may be optional if the packet is a broadcast), a source address, and a bit field indicating the type of packet. Examples of types of packets include a discover packet, a request packet, a response packet, target logical unit number (LUN), etc.

In one example, each of the USDADs 120A, 120B, 120C, and 120D includes a rotary connector 125. The rotary connector 125 may be an 8-position rotary connector. The position of rotary connector 125 in each of the USDADs 120A, 120B, 120C, and 120D correlates to the address of the respective USDAD as well as the type(s) of sensors/equipment that the respective USDAD is to be connected to. This position may be set in advance, before each USDAD is connected to the common bus 130. For example, position 1 of a rotary connector 125 may indicate the address of a USDAD on the bus 130 and also indicate that the USDAD is to be connected to a flow sensor and a valve control. It should be appreciated that a rotary connector 125 is one example of an address indicator, and that other address indicators may be used as an alternative.

In this example, the USDADs 120A, 120B, 120C, and 120D operate in two modes: discovery mode and normal mode. In the normal mode, packets are transmitted in a round robin fashion with the USDADs 120A, 120B, 120C, and 120D boards cooperatively sharing the common bus 130. In discovery mode, each of the USDADs 120A, 120B, 120C, and 120D transmits packets at random times on the common bus 130 while alternately listening for other packets sent by other USDADs (when not transmitting). This mode is transitory and is used for learning the addresses of other USDADs on the common bus 130. The discovery mode may be initiated when a packet with bits set to anything but 0 is transmitted on the common bus 130 by any of the USDADs.

During discovery mode, each of the USDADs 120A, 120B, 120C, and 120D uses its assigned serial number to seed a random number generator. Additionally, each of the USDADs 120A, 120B, 120C, and 120D allocates a list of addresses of the other USDADs on the bus 130. This list is populated during the discovery mode and stored internally in each USDAD.

Using the random number generated, which may be, for example, between 100 and 1000, each of the USDADs 120A, 120B, 120C, and 120D will wait that amount of time in milliseconds in listen mode and then transmit a single broadcast packet with bits set to all 1s, the target address set to broadcast, and the source address set to the position number indicated by the rotary connector 125.

After sending the broadcast packet, each of the USDADs 120A, 120B, 120C, and 120D will go into listen mode for, e.g., one second plus an additional amount of time defined as 1000 milliseconds minus the random number generated. During the listen mode, the USDADs 120A, 120B, 120C, and 120D receive packets on the common bus 130 being transmitted by the other USDADs. Each of the USDADs 120A, 120B, 120C, and 120D populates and maintains the internal list of addresses of the other USDADs learned from receiving packets from the other USDADs.

If one USDAD receives a packet from another USDAD that has the same source address as the receiving USDAD, the receiving USDAD may increment its own source address up by 0x10 (hex 10), regenerate a random number, and transmit a broadcast packet as described above. The receiving USDAD may also illuminate an LED to indicate that there is a duplicate address on the bus.

During discovery mode, each of the USDADs 120A, 120B, 120C, and 120D may iteratively transmit broadcast packets and listen for packets from other USDADs for a number of runs, e.g., 8 runs. Then, the USDADs 120A, 120B, 120C, and 120D will exit discovery mode.

After discovering the addresses of the other USDADs during discovery mode, the USDADs 120A, 120B, 120C, and 120D enter the normal mode. In this mode, each USDAD now has an internal list of addresses of the other USDADs that was populated during the discovery mode. This list may be sorted in numerical order. During normal mode, the internal address list of each USDAD is not altered.

During the normal mode, each of the USDADs 120A, 120B, 120C, and 120D transmits data to the other USDADs at a transmit time determined based on the addresses of the other USDADs. In particular, each USDAD determines the transmit time based on predicted receive times at which data will be received from the other USDADs based on the addresses of the other USDADs. Each of the USDADs 120A, 120B, 120C, and 120D also determines the transmit time based on its address with respect to the addresses of the other USDADs.

For example, if the address of USDAD 120A is the first entry in the list of addresses (e.g., the lowest number) then the USDAD 120A will transmit a normal broadcast packet containing its sensor data. After that, the USDAD 120A will go back into receive mode and wait for a period of time corresponding to the predicted receive times of data from the other USDADs before transmitting another packet. The period of time may be, for example, 2 seconds times the number of entries in the internal address list.

If the address of a USDAD is not the first entry in the address list, then the USDAD will wait until it receives a packet with an address value that is one entry lower in the address list from its own entry. For example, if the address of the USDAD 120A is address 3, and USDAD 1206 has the next lower address in the address list, then the USDAD 120A can predict a receive time as the time it will take for the USDAD 120B to transmit a packet, e.g., 2 seconds. USDAD 120A will wait until a packet is received from USDAD 120B. When that packet is received, USDAD 120A may wait, for example, 500 milliseconds, and then transmit its own packet of sensor data.

This process will continue until all the USDADs 120A, 120B, 120C, and 120D have transmitted their data. This creates a round-robin packet ordering of sensor data, and each of the USDADs 120A, 120B, 120C, and 120D are only allowed to transmit data at their respective transmit times based on the predicted receive times of the other USDADs. Collisions cannot occur because each USDAD must wait for the USDAD having the next lowest address in the address list to transmit a packet before the USDAD can transmit its own packet.

If, for example, a USDAD does not receive a packet from another USDAD having an address in its internal address list for a period of time, e.g., 6 seconds, this may be an indication that another USDAD has lost power or has been removed from the common bus 130. In this case, the USDAD may begin a fresh discovery cycle. Thus, if any of the USDADs loses power, the USDADs on either side of it will continue to transmit data across the dead board and will also detect that the board is dead and rebuild their topology around it.

Whenever any USDAD on the common bus 130 transmits a packet with the discovery bit set, then the other USDADs on the common bus 130 will go into discover mode. That is, for example, if a USDAD receives a packet from another USDAD with the discovery bit set, and the address of the other USDAD is not already in the internal address list of the receiving USDAD, this may be an indication that a new USDAD has been added to the common bus. In this case, the receiving USDAD will enter discovery mode.

Using the address discovery process described above, each of the USDADs 120A, 120B, 120C, and 120D learns the addresses of the other USDADs connected to the common bus 130. In addition, each USDAD learns what sensors and equipment may be connected to the other USDADs.

Also, as the USDADs are able to predict the receive times of data based on the addresses of the other USDADs and determine a transmit time based on the predicted receive times, this process avoids data collisions. This is advantageous as it allows for specific responses to events with specific timings. For example, if a leak detector connected to USDAD 120A senses a leak, and the valve that needs to be closed to prevent damage is connected to USDAD 120B, it is important to know how long it will take for the USDAD 120A to communicate the sensed leak to USDAD 120B. As the process described above avoids data collisions which would otherwise result in unknown retransmit times, this process allows it to be known with certainty how long it will take for the USDAD 120A to communicate the sensed leak data to USDAD 120B.

Turning now to an explanation of sensor data collection, reference is made back to FIG. 1A. As shown in FIG. 1A, each of the USDADs 120A, 120B, 120C, and 120D collects sensor data from the connected sensor(s). Each of the USDADs 120A, 120B, 120C, and 120D also sends the sensor data collected from a connected sensor and may receive other sensor data collected from sensors connected to the other USDADs. Based on the sensor data from the connected sensor and the other sensor data received from sensors connected to the other USDADs, each of the USDADs 120A, 120B, 120C, and 120D may initiate action by equipment to which it is connected, or other equipment connected to another USDAD. Such action may be initiated by a USDAD sending a control signal to connected equipment or to another USDAD to which the equipment is connected. In this manner, each of the USDADs 120A, 120B, 120C and 120D may act as a controller, such that the central controller 150 may be optional.

For example, the USDAD 120D may determine that there is a leak in water cooling equipment based on sensor data collected from the flow meter 140F connected to the USDAD 120D and/or sensor data collected from the water pressure sensor 140D connected to the USDAD 120C. In response, the USDAD 120D may initiate action by the supply value 145C connected to the USDAD 120D to turn the supply valve off. Also, the USDAD 120D may initiate action by a power supply (not shown) by sending an emergency power off (EPO) signal to the power supply, such that all the USDADs 120A, 120B and 120C, and 120D are turned off.

Although in the example shown in FIG. 1A, the USDADs are connected in a daisy chain sequence, and the USDAD 120A is directly connected to the central controller 150, there may be redundant connections for fault isolation and redundancy. This may be understood with reference to FIGS. 3A-3C.

Figure 3A:
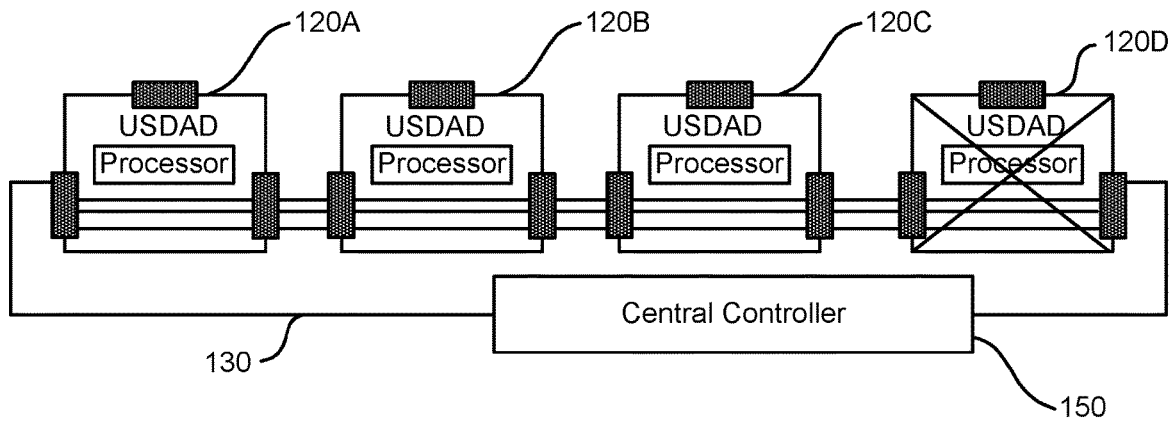
FIGS. 3A, 3B, and 3C conceptually illustrate redundancy and fault isolation for a system including universal sensor data acquisition devices, according to one or more examples of the disclosure.
Figure 3B:
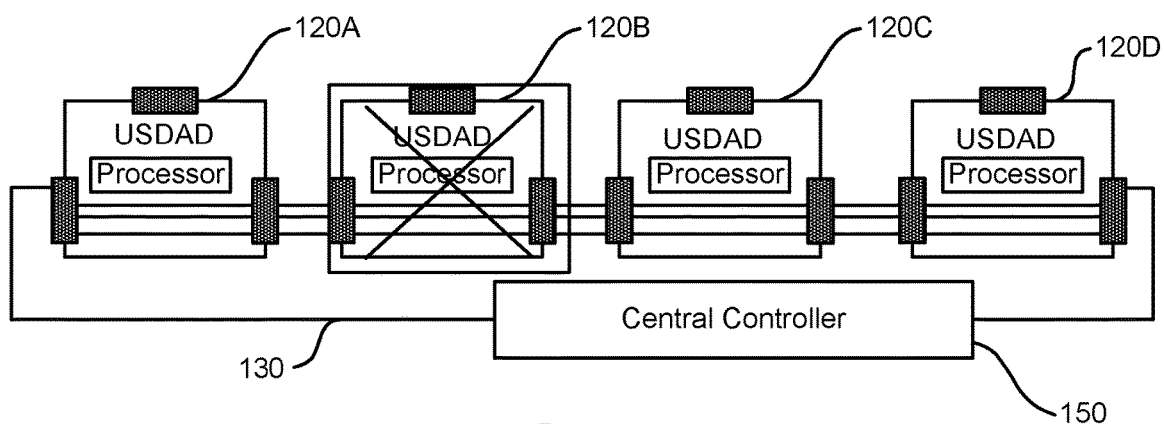
Figure 3C:
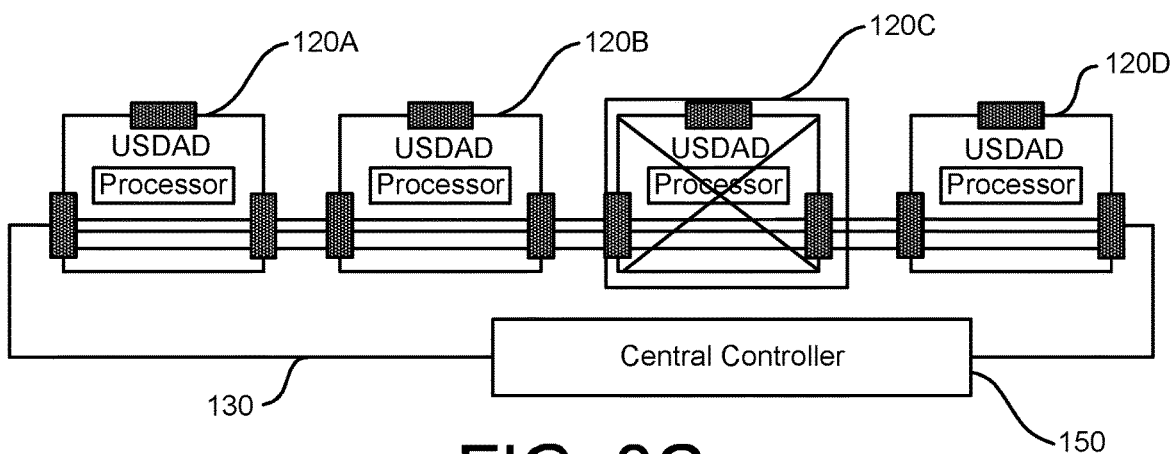

As shown in FIGS. 3A-3C, the USDADs 120A, 120B, 120C and 120D are connected in a serial sequence with the central controller 150 in a manner similar to the shown in FIG. 1A. However, in addition the USDAD 120A being directly connected to the central controller 150 via the common bus, the USDAD 120D may also be directly connected to the central controller 150 via the common bus. This provides for fault isolation and redundancy, in the case of failure or removal for servicing of one or more of the USDADs 120A, 120B, 120C, and 120D and/or connected sensors(s) and equipment.

According to one example, the central controller 150 may act in a primary mode, communicating with the sequence of USDADs 120A, 120B, 120C, and 120D via the common bus 130 directly connecting the central controller 150 to the USDAD. The central controller 150 may switch to a secondary failover mode as needed, communicating with the sequence of USDADs 120A, 120B, 120C, and 120D via the common bus 130 directly connecting the central controller to the USDAD 120D. According to another example, the central controller 150 may communicate with the sequence of USDADs 120A, 120B, 120C, and 120D via the common bus 130 directly connecting the central controller 150 to both the USDAD 120A and the USDAD 120D as needed.

For instance, as shown in FIG. 3A, if the USDAD 120D fails or is removed for servicing, the central controller 150 is able to collect sensor data from and provide control signals and power to the USDAs 120A, 120B, and 120C via the common bus 130 directly connecting the central controller 150 to the USDAD 120A.

Similarly, as shown in FIG. 3B, if the USDAD 120B fails or is removed for servicing, the central controller 150 is able to collect sensor data from and provide control signals and power to the USDAD 120A via the common bus 130 directly connecting the central controller 150 to the USDAD 120A. Also, the central controller 150 is able to collect sensor data from and provide control signals and power to the USDADs 120C and 120D via the common bus directly connecting the central controller to the USDAD 120D.

As another example, as shown in FIG. 3C, if the USDAD 120C fails or is removed for servicing, the central controller 150 is able to collect sensor data from and provide control signals and power to the USDADs 120A and 120B via the common bus 130 directly connecting the central controller 150 to the USDAD 120A. Also, the central controller 150 is able to collect sensor data from and provide control signals and power to the USDAD 120D via the common bus 130 directly connecting the central controller 150 to the USDAD 120D.

Although one central controller 150 is shown in FIGS. 3A-3C, there may be multiple central controllers for redundancy. For example, there may be a central controller 150 connected directly to the USDAD 120A and another central controller 150 connected directly to the USDAD 120D. In this example, if one of the central controllers fails, the other central controller will be able to collect sensor data from and provide control signals and power to the other USDADs in a manner similar to that described above.

Additionally, in this example, if one of the USDADs fails, one or both of the central controllers will still be able to collect sensor data from and provide control signals and power to the other USDADs. For instance, referring again to FIG. 3A, if the USDAD 120D fails or is removed for servicing, the central controller 150 connected directly to the USDAD 120A is able to collect sensor data from and provide control signals and power to the USDAs 120A, 120B, and 120C via the common bus 130. Similarly, referring again to FIG. 3B, if the USDAD 120B fails or is removed for servicing, the central controller 150 connected directly to the USDAD 120A is able to collect sensor data from and provide control signals and power to the USDAD 120A, and the central controller 150 connected directly to the USDAD 120D is able to collect sensor data from and provide control signals and power to the USDADs 120C and 120D. Further, referring again to FIG. 3C, if the USDAD 120C fails or is removed for servicing, the central controller 150 connected directly to the USDAD 120A is able to collect sensor data from and provide control signals and power to the USDADs 120A and 120B, and the central controller 150 connected directly to the USDAD 120D is able to collect sensor data from and provide control signals and power to the USDAD 120D.

Figure 4:
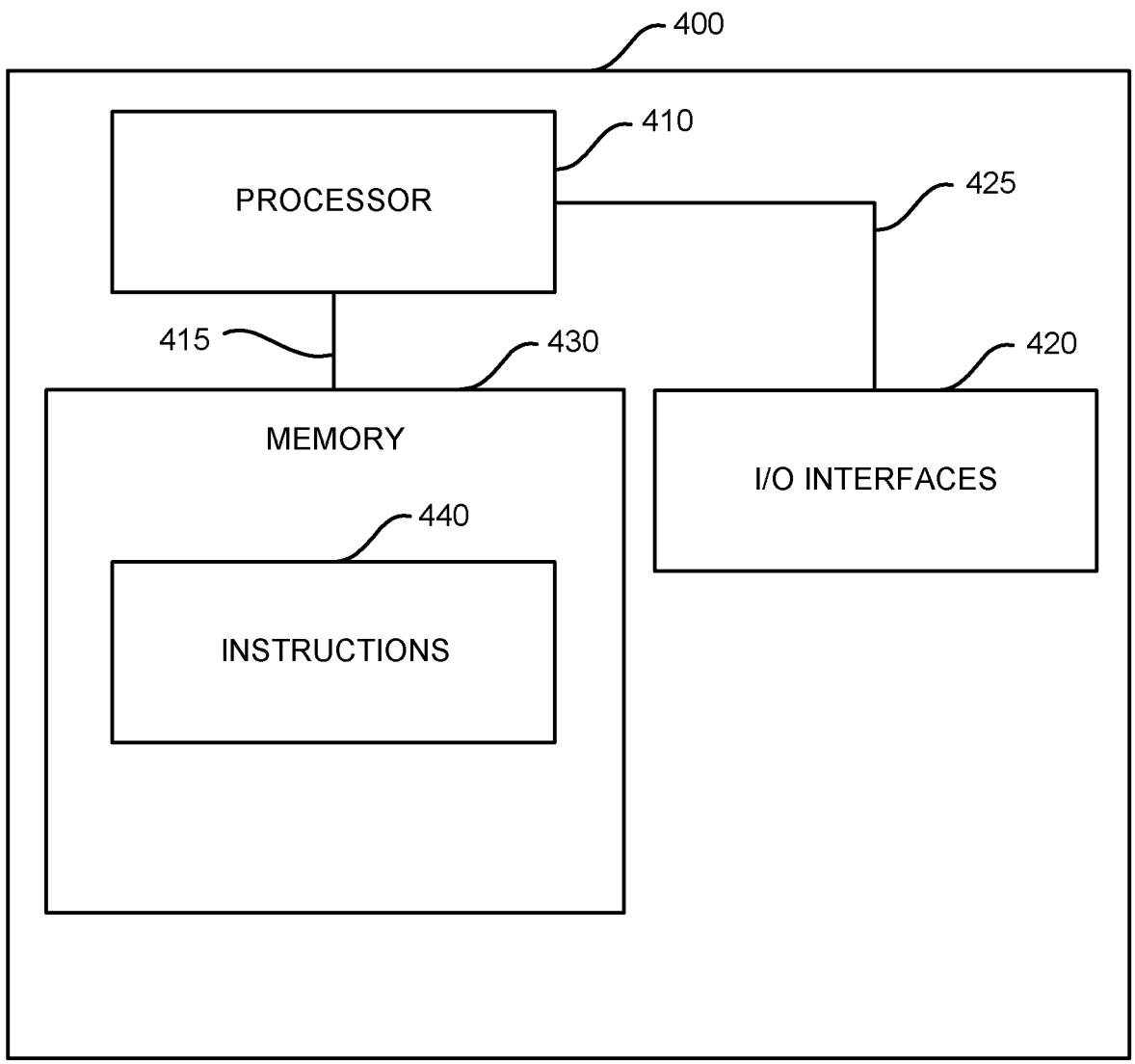
FIG. 4 conceptually illustrates a computing device with which each universal sensor data acquisition device shown in FIG. 1A may be implemented, according to one or more examples of the disclosure.

FIG. 4 is a block diagram of a computing device 400 with which the USDADs 120A, 120B 120C, and 120D shown in FIGS. 1A and 1B may be implemented, according to illustrative examples. The central controller 150 may also be implemented with a computing device, such as the computing device 400 shown in FIG. 4. Although not shown, the components of the computing device 400 may be mounted on a printed circuit assembly (PCA) board.

Referring to FIG. 4, the computing device 400 includes a processor 410 that is communicatively coupled to input/output interfaces 420 via an address/data bus 425. The processor 410 receives inputs and transmits outputs via input/output (I/O) interfaces 420. The processor 410 can be any commercially available or custom microprocessor or microcontroller. The I/O interfaces 420 may include any suitable connection interfaces, such as power input interfaces, data interfaces, sensor input interfaces, and equipment output interfaces. The power and data input/output interface may include data and power I/O ports on the PCA board to which the computing device 400 is mounted. The sensor input interfaces and equipment output interfaces may include pins on the PCA board to which the computing device 400 is mounted.

The processor 410 communicates with memory 430 via, e.g., an address/data bus 415. The memory 430 is representative of a memory device containing the software and data used to implement the functionality of the computing device 400. The memory 430 can include, but is not limited to, an electrically erasable programmable read-only memory (EE-PROM) implemented as firmware. As shown in FIG. 4, the memory 430 may include several categories of software and data used in the computing device 400, including instructions 440.

The instructions 440 can be stored in the memory 430 and can be executed by the processor 410. The instructions 440 include various programs that implement the various features of the computing device 400. For example, the instructions 440 may include instructions to implement the functions of the USDADs 120A, 120B, 120C, and 120D (including determining a type of connected sensor, determining a location with respect to the server rack, determining a position with respect to other USDADs, discovering addresses of other USDADs, determining a transmit time, collecting sensor data from a sensor, sending and receiving collected sensor data to and from other USDADs, receiving and/or sending control data to initiate an action by connected equipment, etc.).

The memory 430 may also store static and dynamic data used by the instructions 440 other software programs that may reside in the memory 430. The data that may be stored in the memory may include, e.g., collected sensor data, information associating specific types of sensors and equipment with locations at which such sensors and equipment are mounted or installed within or around the server rack, addresses discovered during discovery mode, etc.

It should be understood that FIG. 4 and description above are intended to provide a brief, general description of a suitable environment in which the various aspects of some examples of the present disclosure can be implemented. While the description includes a general context of executable instructions stored in firmware, the present disclosure can also be implemented in combination with other program modules and/or as a combination of hardware and software in addition to, or instead of, processor executable instructions. For example, the USDADs 120A, 120B, 120C, and 120D could be implemented in whole or in part on specialized hardware, for example in a field-programmable gate array in order to achieve faster computation times.

Figure 5A:
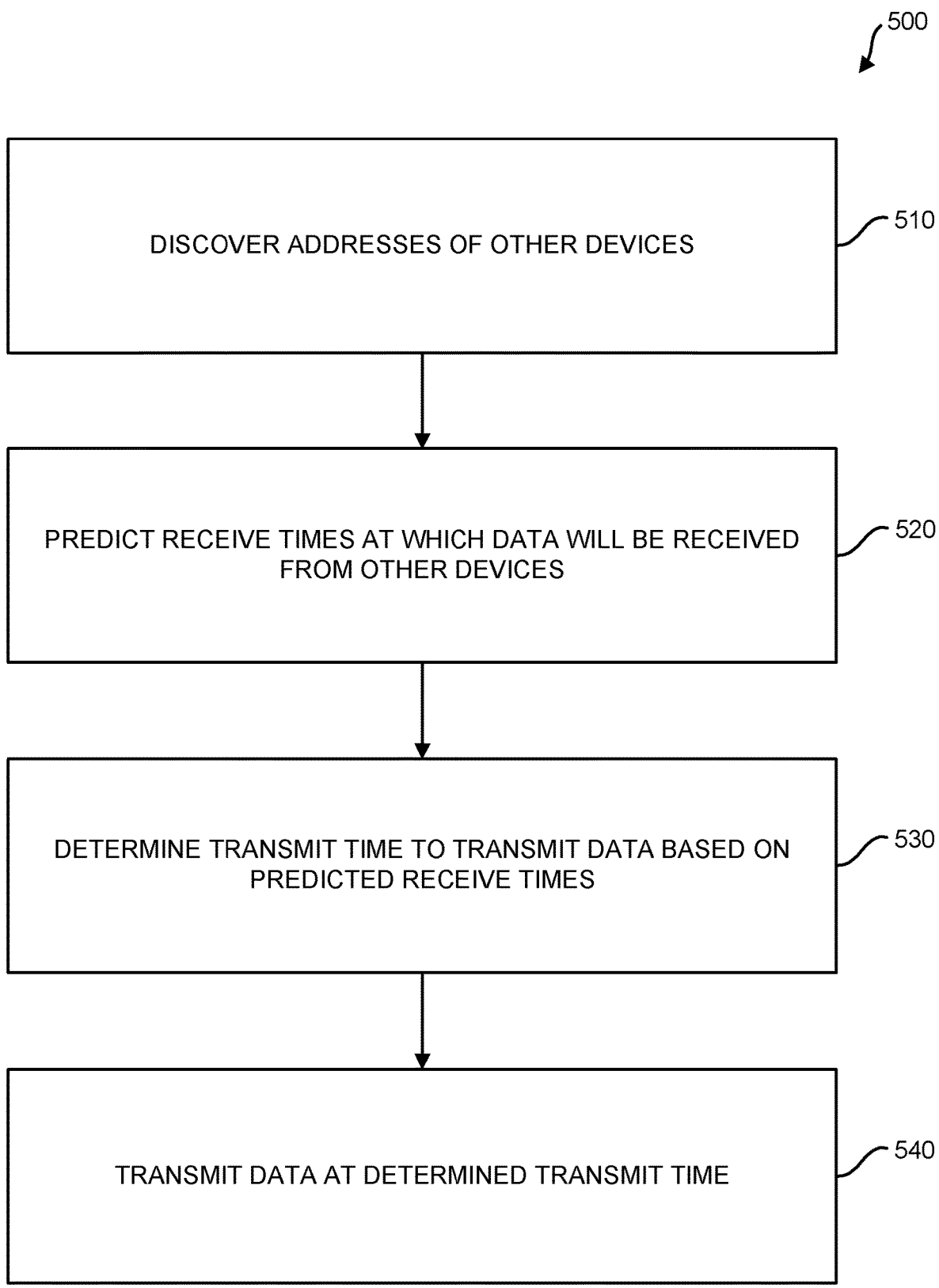
FIG. 5A is a flowchart depicting a method for determining transmit and receive times of devices connected via a bus according to one or more examples of the disclosure.

FIG. 5A is a flowchart depicting a method 500 for determining transmit and receive times of devices connected via a bus according to one or more examples of the disclosure. The method may be performed by, for example, one or more of the USDADs 120A, 120B, 120C and 120D shown in FIG. 1A. As shown in FIG. 5A, the method 500 includes discovering addresses of other devices connected to a device via a common bus at 510. At 520, the receive times at which data will be received from the other devices is predicted based on the addressees of the other devices. At 530, the transmit time to transmit data from the device based on the predicted receive times is determined, such that data collisions are avoided. At 540, data is transmitted to the other devices at the determined transmit time.

Figure 5B:
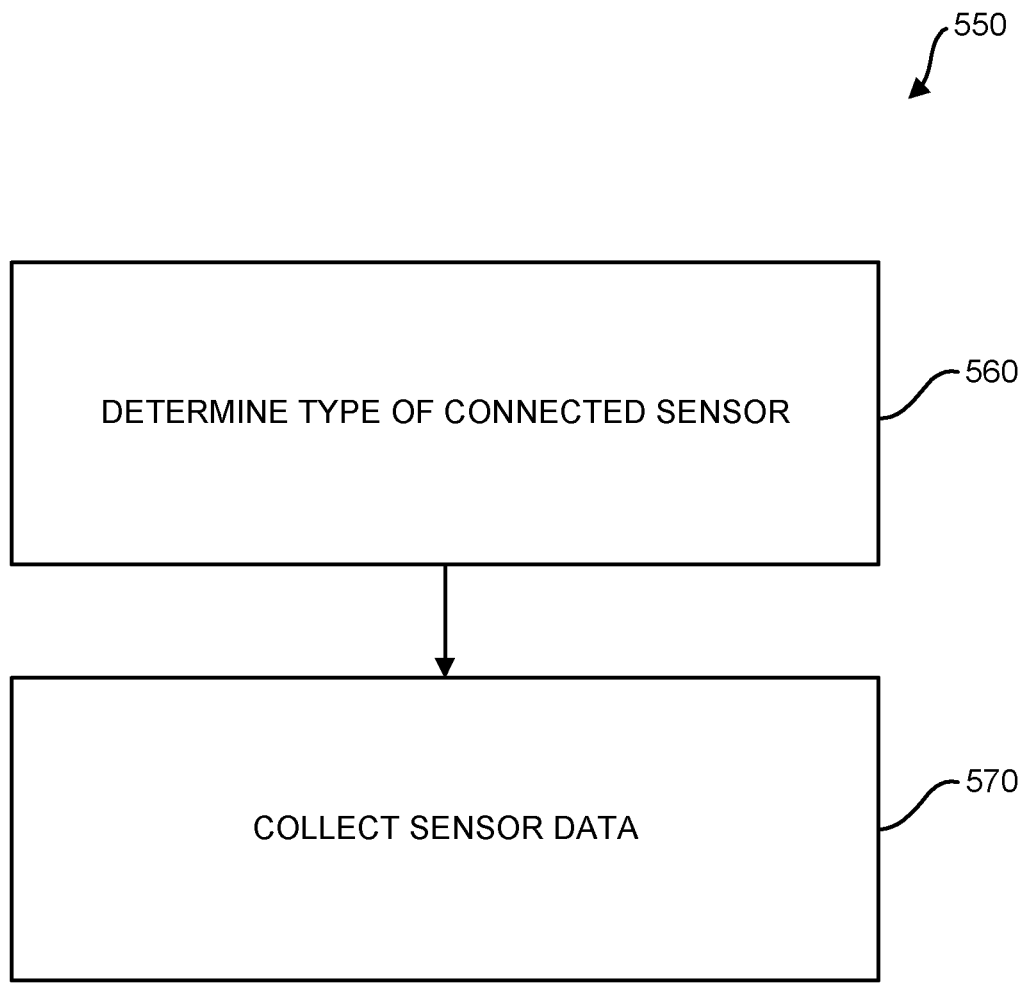
FIG. 5B is a flowchart depicting a method for universal sensor data acquisition, according to one or more examples of the disclosure.

FIG. 5B is a flowchart depicting a method 550 for universal sensor data acquisition, according to one or more examples of the disclosure. The method may be performed by, for example, one or more of the USDADs 120A, 120B, 120C and 120D shown in FIG. 1A. The method 550 may be performed as a continuation of the method 500 or as a stand-along method.

As shown in FIG. 5B, the method 550 includes determining a type of a connected sensor within a server rack at 560. This determination may be made, for example, by detecting the connection of the sensor at an input interface or by determining the location of the USDAD with respect to a server rack, as described above. The sensor data is collected from the connected sensor at 570.

Although not shown, the method may include additional steps, such as sending the sensor data collected from the connected sensor to other USDADs and/or a central controller, receiving other sensor data collected from other sensor(s) connected to the other USDADs, and initiating actions by connected equipment based on sensor data collected from the connected sensor and/or the other sensor data collected from the other sensors.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A device, comprising;
    a processor; and
    a memory communicatively coupled to the processor and having instructions stored thereon that, when executed by the processor, cause the processor to:
        discover addresses of other devices in communication with the device via a common bus; and
        transmit data to the other devices at a transmit time determined based on the addresses of the other devices;
    wherein the device is a universal data acquisition device that is connectable to a plurality of different types of sensors arranged within a server rack and is also connectable to different types of equipment, and the instructions, when executed by the processor, cause the processor to:
  determine a type of a connected sensor; and
  collect sensor data from the connected sensor.

2. The device of claim 1, wherein the instructions, when executed by the processor, cause the processor to predict receive times at which data will be received from the other devices based on the addresses of the other devices.

3. The device of claim 2, wherein the instructions, when executed by the processor, cause the processor to determine the transmit time based on predicted receive times at which data will be received from the other devices, such that data collisions are avoided.

4. The device of claim 1, wherein the other devices are universal sensor data acquisition devices that are connectable to the plurality of different types of sensors arranged within the server rack, and the instructions cause the processor to send the sensor data collected from the connected sensor and to receive other sensor data collected by the at least one other universal sensor data acquisition device via the common bus.

5. The device of claim 4, wherein the instructions cause the processor to initiate an action by connected equipment in operation based on at least one of the collected sensor data from the connected sensor and the other sensor data collected by the at least one other universal sensor data acquisition device.

6. The device of claim 4, wherein the instructions further cause the processor to:
  detect a position of the device with respect to the at least one other device connected via the common bus;
  determine a location of the device with respect to the server rack based on the detected position; and
  determine the type of connected sensor based on the location of the device with respect to the server rack.

7. The device of claim 4, wherein the instructions further cause the processor to detect connection of a sensor at an input interface, wherein the type of connected sensor is determined based on the detected connection.

8. The device of claim 4, wherein:
  the different types of connected sensors include at least one of a water temperature sensor, an air temperature sensor, a door sensor, a water pressure sensor, and a flow sensor; and
  the different types of equipment include at least one of a door controller, a return valve controller, and a supply valve controller.

9. A system, comprising;
  a common bus;
  a plurality of devices arranged on the common bus, wherein each device is to:
    discover addresses of other devices among the plurality of devices arranged on the common bus; and
    transmit data to the other devices at a transmit time determined based on the addresses of the other devices;
  wherein the plurality of devices include a plurality of universal sensor data acquisition devices that are arranged on the common bus in a sequence at respective serial locations with respect to a server rack housing a plurality of servers and including a plurality of different types of sensors, each of the universal sensor data acquisition devices connectable to different types of sensors to collect sensor data.

10. The system of claim 9, wherein each device is to predict receive times at which data will be received from the other devices based on the addresses of the other devices.

11. The system of claim 10, wherein each device is further to determine the transmit time based on predicted receive times at which data will be received from the other devices, such that data collisions are avoided.

12. The system of claim 9, wherein the devices are to communicate over the bus using a multi-master bus protocol.

13. The system of claim 9, further comprising a central controller to collect the sensor data collected by each of the plurality of universal sensor data acquisition devices.

14. A method, comprising:
  discovering, by a device that is in communication with other devices arranged on a common bus, addresses of the other devices;
  transmitting data to the other devices at a transmit time determined based on the addresses of the other devices;
  determining a type of a connected sensor; and
  collecting sensor data from the connected sensor; wherein the device is a universal sensor data acquisition device that is connectable to different types of sensors within a server rack.

15. The method of claim 14, further comprising predicting, by the device, receive times at which data will be received from the other devices based on the addresses of the other devices.

16. The method of claim 15, further comprising determining, by the device, the transmit time based on predicted receive times at which data will be received from the other devices, such that data collisions are avoided.

17. The method of claim 14, wherein the other devices arranged on the common bus are universal sensor data acquisition devices that are connectable to different types of sensors within the server rack, and the method further comprises:
  sending the sensor data to at least one other universal sensor data acquisition device; and
  receiving other sensor data collected by the at least one other universal sensor data acquisition device via the common bus.

* * * * *